United States Patent [19]

Pezzutti

[11] 3,768,026

[45] Oct. 23, 1973

[54] RETRIGGERABLE ONE-SHOT MULTIVIBRATOR

[75] Inventor: David August Pezzutti, Eatontown, N.J.

[73] Assignee: Bell Telephone Laboratories, Incorporated, Murray Hill, N.J.

[22] Filed: Mar. 9, 1972

[21] Appl. No.: 233,087

[52] U.S. Cl. .................. 328/207, 307/265, 307/268, 307/269, 307/273, 328/58

[51] Int. Cl. .............................................. H03k 3/10

[58] Field of Search .................... 307/225, 273, 265, 307/268, 269; 328/48, 58, 207

[56] References Cited

UNITED STATES PATENTS 3,614,632 10/1971 Leibowitz et al. .............. 307/265 X

*Primary Examiner*—John Zazworsky
*Attorney*—W. L. Keefauver

[57] ABSTRACT

A retriggerable one-shot multivibrator is realized by employing a plurality of inverting logic gates, a digital divider and a clock circuit. A first logic gate is used to control the supply of clock pulses to the divider. A second logic gate responds to the divider output to yield the desired multivibrator output and to control the first logic gate. The one-shot multivibrator is triggered by clearing the divider.

10 Claims, 2 Drawing Figures

RETRIGGERABLE ONE-SHOT MULTIVIBRATOR

BACKGROUND OF THE INVENTION

This invention relates to multivibrator circuits and, more particularly, to one-shot multivibrators.

Numerous one-shot multivibrator circuits are known in the art. For the most part, prior one-shot multivibrators employ discrete components including capacitors as timing elements. In some prior known circuits, logic gates are utilized in conjunction with capacitors to form various one-shot multivibrator circuits. Although such circuits have achieved wide acceptance in the art, they have certain undesirable features. Specifically, the use of capacitors as timing or delay elements is undesirable in modern circuits employing integrated circuit components. Additionally, use of capacitors as timing elements is undesirable in one-shot multivibrators of the retriggerable type because of the finite time interval required in recharging the capacitor before retriggering may be achieved.

SUMMARY OF THE INVENTION

These and other problems are resolved, in accordance with the invention, in a one-shot multivibrator having retriggerable capability which includes a digital divider circuit and at least one coincidence gate. Reference pulse signals, for example, clock pulses, are selectively supplied to the divider via the coincidence gate. The divider output represents the desired one-shot multivibrator output and, additionally, controls operation of the coincidence gate. Generation of an output signal from the multivibrator is initiated, in accordance with the invention, by clearing the divider. That is to say, a timing cycle of the one-shot multivibrator is initiated, in accordance with the invention, by setting the digital divider to a predetermined output state.

In one embodiment of the present invention, clock pulses generated at a predetermined fixed interval are supplied to one input of a first NAND gate. The output of the first NAND gate is supplied to a toggle input of a digital divider. Predetermined outputs of the divider are supplied to the inputs of a second NAND gate. Signals developed at the output of the second NAND gate are the desired one-shot multivibrator output and, additionally, are supplied to a second input of the first NAND gate.

Initially, the one-shot multivibrator circuit is disabled. Generation of an output pulse is initiated by clearing the divider. This causes the output of the one-shot multivibrator to switch to a high state which, in turn, enables the first NAND gate. Clock pulses are supplied to the divider until a predetermined count is obtained. Outputs from the divider cause the output of the second NAND gate to switch to a low state, thereby yielding the desired output pulse and again disabling the first NAND gate.

The one-shot multivibrator of this invention may be triggered during a "normal" timing interval, in accordance with the invention, by again clearing the divider. This reinitiates a timing interval and, then, circuit operation is as described above. The normal timing interval of the one-shot multivibrator output pulse signal is determined by the clock pulse interval and the divisor of the digital divider.

BRIEF DESCRIPTION OF THE DRAWING

These and other objects and advantages of the invention will be more fully understood in the following detailed description of the invention taken in accordance with the appended drawings in which.

DETAILED DESCRIPTION

Figure 1:
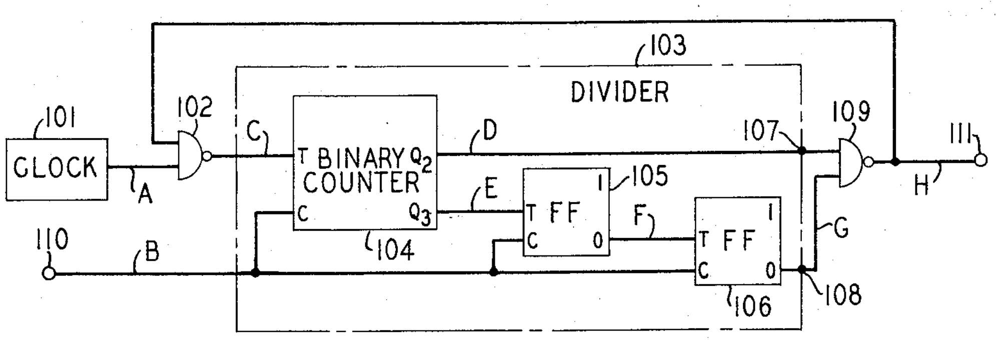
FIG. 1 shows a simplified block diagram of a retriggerable one-shot multivibrator circuit illustrating the invention.
Figure 2:
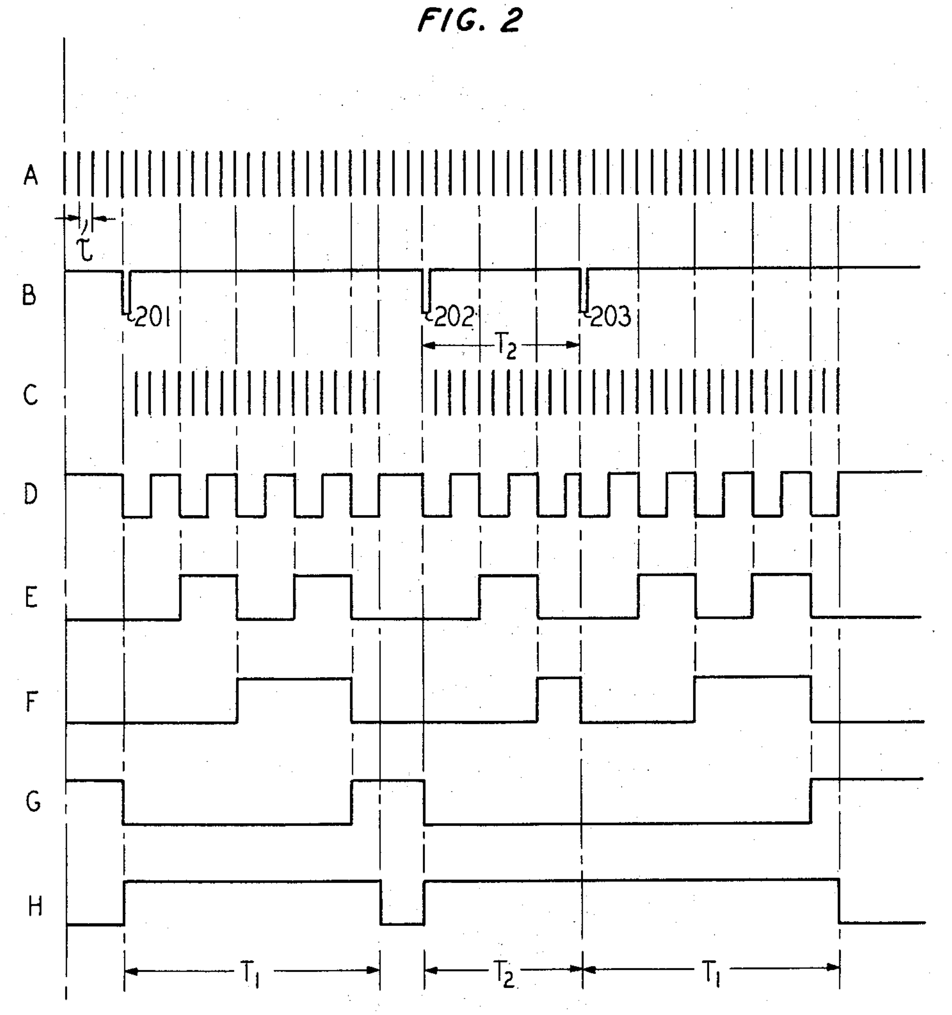
FIG. 2 shows a series of waveforms useful in describing the circuit shown in FIG. 1.

FIG. 1 illustrates a retriggerable one-shot multivibrator, in accordance with the invention. FIG. 2 shows waveforms of signals generated in the circuit of FIG. 1. The waveforms have been labeled to correspond to the points indicated in the circuit of FIG. 1.

Accordingly, reference pulse signals generated at a desired predetermined interval in clock circuit 101 are supplied to one input of NAND gate 102. In most digital systems clock pulse signals are readily available and, therefore, an additional clock pulse generator is not required. Initially, NAND gate 102 is disabled by a signal supplied to its second input. In this example, NAND gate 102 is controlled by the normal one-shot output signal developed at point 111. The output of NAND gate 102 is supplied to one input of digital divider 103. Divider 103 may take on any form capable of making the desired digital division. In this example, not to be construed as limiting the scope of the invention, divider 103 has a divisor of 18 so that a desired "normal" timing interval is obtained. The division of 18 is obtained, in this example, by utilizing binary counter 104, J-K flip-flop 105 and J-K flip-flop 106. Signals developed at outputs 107 and 108 of divider 103, are supplied to the inputs of NAND gate 109. Signals developed at the output of NAND gate 109 represent the desired one-shot multivibrator output and, additionally, are supplied to a second input of NAND gate 102.

In operation, pulse signals generated in clock 101, as shown in waveform A of FIG. 2, are supplied to a first input of NAND gate 102. The interval between clock pulses, for example, interval $\tau$ shown in waveform A of FIG. 2, is selected to achieve a desired precision in triggering the one-shot multivibrator of this invention. Initially, a low state signal is supplied to a second input of NAND gate 102, as shown in waveform H of FIG. 2. Thus, the one-shot multivibrator is disabled. Then, the one-shot multivibrator is triggered, in accordance with the invention, by a pulse signal, for example, pulse 201 shown in waveform B of FIG. 2, supplied via terminal 110 to the clear inputs of binary counter 104, J-K flip-flop 105 and J-K flip-flop 106. Actually, binary counter 104, flip-flop 105 and flip-flop 106 are set to a predetermined initial state. In this example, outputs $Q_2$ and $Q_3$ of the counter 104 are set to an initial low state, as shown in waveforms D and E of FIG. 2, respectively. Similarly, the zero outputs of flip-flops 105 and 106 are also set to an initial low state, as shown in waveforms F and G of FIG. 2, respectively. Consequently, the signals supplied to the inputs of NAND gate 109, as shown in waveforms D and G of FIG. 2, are now both at a low state. This causes the output of NAND gate 109 to switch to a high state, as shown in waveform H of FIG. 2. In turn, NAND gate 102 responds to the high state output of NAND gate 109 to supply clock pulses, as shown in waveform C of FIG. 2, to the toggle input of binary counter 104. Counter 104 responds to the supplied clock pulses to generate signals at its $Q_2$ and $Q_3$ outputs as shown in waveforms D and E of FIG. 2, respectively. Signals developed at the $Q_2$ and $Q_3$ outputs of counter 104 are supplied to one input of NAND gate 109 and to the toggle input of flip-flop 105, respectively. Flip-flop 105 responds to the $Q_3$ output of divider 104 to generate a signal at its zero output as shown in waveform F of FIG. 2. Similarly, flip-flop 106 responds to the zero output of flip-flop 105 to generate a signal at its zero output as shown in waveform G of FIG. 2. The zero output of flip-flop 106 is supplied to a second input of NAND gate 109.

As is seen from the waveforms of FIG. 2, the output of NAND gate 109 (FIG. 1) at point 111, remains in a high state until 18 clock pulses have been supplied to divider 103. This initial output of NAND gate 107 represents a "normal" timing interval of the one-shot multivibrator and is indicated in waveform H of FIG. 2 as interval $T_1$. After 18 pulses have been supplied to divider 103 (FIG. 1) the output of NAND gate 109 switches to a low state (waveform H, FIG. 2), thereby inhibiting NAND gate 102 and disabling the one-shot multivibrator of this invention until another trigger pulse is supplied to clear divider 103. Accordingly, a pulse signal is developed at point 111 having an interval $T = N\tau$, where $\tau$ equals the interval between clock pulses and N equals the divisor of divider 103, in this example $N = 18$.

Circuit operation, as described above, is iterated for each subsequent trigger pulse supplied to the clear input of divider 103, provided the interval between such pulses is greater than $T_1$. For example, another "normal" timing interval is initiated by pulse 202 of waveform B, FIG. 2. However, when a trigger pulse is supplied via terminal 110 (FIG. 1) to clear divider 103 prior to the termination of a "normal" timing interval, still another "normal" timing interval is substantially instantaneously initiated. In this example, the timing interval initiated by pulse 202 (FIG. 2) is terminated after interval $T_2$ and another normal interval is initiated. The resulting interval is shown as interval $T_2 + T_1$ in waveform H of FIG. 2. This assumes that no additional retriggering of the one-shot is effected, in accordance with the invention, prior to the termination of an interval having a duration $T_1$. If no additional trigger pulses are received during "normal" timing interval $T_1$, the one-shot "times-out" and returns to its initial disabled state.

As stated above, the retriggering recovery time of the one-shot multivibrator of this invention is controlled by the interval between clock pulses, namely, interval $\tau$ of waveform A, FIG. 2. Thus, the recovery time may be decreased by increasing the frequency of clock 101 (FIG. 1). Accordingly, a retriggerable one-shot multivibrator having rapid recovery time is realized by employing digital components without utilizing capacitors as timing elements.

The above-described arrangements are, of course, merely illustrative of the application of the principles of this invention. Numerous other arrangements may be devised by those skilled in the art without departing from the spirit and scope of the invention. For example, other logic circuits than NAND gates may be employed to control the supply of clock pulses to a digital divider to obtain desired timing intervals.

What is claimed is:

1. A retriggerable one-shot multivibrator which comprises, first means for generating a control signal having a normal interval directly related to a number of reference pulse signals supplied to said first means, said first means being responsive to each one of supplied trigger signals for generating a corresponding control signal, and second means responsive to said control signal for selectively supplying said reference pulse signals to said first means, wherein said control signal is the desired one-shot multivibrator output signal.

2. The invention as defined in claim 1 wherein said second means includes first logic network means responsive to said control signal for selectively supplying said reference pulse signals to said first means.

3. The invention as defined in claim 2 wherein said first means includes divider means having first and second inputs and an output, said reference pulses being supplied to said first input, said control signal being developed at said output and said trigger signals being supplied to said second input, said divider means being set to a predetermined output state in response to each of said trigger signals.

4. The invention as defined in claim 2 wherein said first means includes digital divider means having first and second inputs and at least one output, said reference pulse signals being supplied to said first input for generating predetermined signals at said at least one output, said trigger signals being supplied to said second input for setting said divider means to a predetermined output state in response to each of said trigger signals, and second logic network means in circuit relationship with said at least one output for generating said control signal in response to said predetermined signals developed at said divider means output.

5. The invention as defined in claim 4 wherein said first and second logic network means each includes a coincidence gate.

6. A digital retriggerable one-shot multivibrator which comprises, digital divider means for generating predetermined output signals in response to reference pulse signals, said divider means being set to a predetermined output state in response to each one of supplied trigger signals, first means selectively responsive to said divider means output signals for generating a control signal having an interval directly related to the number of reference pulses supplied to said divider means, a corresponding control signal being generated in response to each one of said trigger signals, and second means responsive to said control signal for selectively supplying said reference pulse signals to said divider means, said second means being enabled only during intervals in which said divider means is in said predetermined output state, wherein said control signal represents the desired one-shot multivibrator output signal.

7. The invention as defined in claim 6 wherein said second means includes first logic network means responsive to said control signal and said reference pulse signals for selectively supplying pulse signals representative of said reference pulse signals to said divider means during said control signal interval.

8. The invention as defined in claim 7 wherein said first means includes second logic network means for generating said control signal in accordance with a selected code of said divider means output signals.

9. The invention as defined in claim 8 wherein said first and second logic network means each includes a coincidence logic gate.

10. The invention as defined in claim 9 wherein said digital divider means generates output signals in a predetermined code directly related to the number of supplied reference pulse signals and wherein said first and second logic network means each includes a NAND logic gate.

* * * * *